(12) United States Patent
Cheng et al.

(10) Patent No.: US 11,164,929 B2
(45) Date of Patent: Nov. 2, 2021

(54) DISPLAY SUBSTRATE INCLUDING ELECTRICALLY INTERCONNECTING LIGHT SHIELDING LAYER AND BARRIER STRUCTURE BETWEEN GROOVES, AND METHOD OF FORMING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Cheng, Beijing (CN); Shun Zhang, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/767,972

(22) PCT Filed: Dec. 18, 2019

(86) PCT No.: PCT/CN2019/126183
§ 371 (c)(1),
(2) Date: May 28, 2020

(87) PCT Pub. No.: WO2020/147491
PCT Pub. Date: Jul. 23, 2020

(65) Prior Publication Data
US 2021/0074788 A1   Mar. 11, 2021

(30) Foreign Application Priority Data
Jan. 14, 2019 (CN) .......................... 201910031922.1

(51) Int. Cl.
*H01L 27/32* (2006.01)
*H01L 51/56* (2006.01)

(52) U.S. Cl.
CPC ...... *H01L 27/3272* (2013.01); *H01L 27/3276* (2013.01); *H01L 51/56* (2013.01); *H01L 2227/323* (2013.01)

(58) Field of Classification Search
CPC ..................... H01L 27/3272; H01L 27/3276
See application file for complete search history.

(56) References Cited

U.S. PATENT DOCUMENTS 9,831,349 B2    11/2017  Ishikawa et al.
2001/0040645 A1*  11/2001  Yamazaki ......... G02F 1/133305
                                                     349/42

(Continued)

FOREIGN PATENT DOCUMENTS

CN      107505778 A      12/2017
CN      107887406 A       4/2018

(Continued)

*Primary Examiner* — Matthew E. Gordon
(74) *Attorney, Agent, or Firm* — Muncy, Geissler, Olds & Lowe, P.C.

(57) ABSTRACT

A display substrate, a method of forming the same and a display device are provided. The display substrate includes: a base substrate, and a light shielding layer, a first insulating layer, a first metal layer, a second insulating layer and a light emitting device stacked in sequence on the base substrate; where the second insulating layer has a first groove and a second groove, and a portion of the second insulating layer between the first groove and the second groove forms a barrier structure; the first groove is at a side of the barrier structure adjacent to the light emitting device with respect to the second groove; the first metal layer includes a signal line at a side of the first groove away from the barrier structure and a connection terminal at a side of the second groove away from the barrier structure; the light shielding layer (Continued)

includes a connection lead through which the signal line and the connection terminal are electrically connected.

10 Claims, 3 Drawing Sheets

(56) References Cited

U.S. PATENT DOCUMENTS

| | | | |
|---|---|---|---|
| 2018/0006104 A1* | 1/2018 | Jung | ................... H01L 51/0096 |
| 2018/0097047 A1 | 4/2018 | Jung et al. | |
| 2018/0123078 A1 | 5/2018 | Byun et al. | |
| 2018/0138451 A1 | 5/2018 | Kim | |
| 2018/0181240 A1 | 6/2018 | Heo et al. | |
| 2018/0190742 A1 | 7/2018 | He et al. | |
| 2018/0198092 A1 | 7/2018 | Choi et al. | |
| 2018/0226612 A1 | 8/2018 | Choi et al. | |
| 2020/0321405 A1* | 10/2020 | Kang | ................... H01L 51/5225 |

FOREIGN PATENT DOCUMENTS

| | | |
|---|---|---|
| CN | 108010935 A | 5/2018 |
| CN | 108241449 A | 7/2018 |
| CN | 108336109 A | 7/2018 |
| CN | 108957884 A | 12/2018 |
| CN | 109119452 A | 1/2019 |
| CN | 109713017 A | 5/2019 |

* cited by examiner

DISPLAY SUBSTRATE INCLUDING ELECTRICALLY INTERCONNECTING LIGHT SHIELDING LAYER AND BARRIER STRUCTURE BETWEEN GROOVES, AND METHOD OF FORMING THE SAME

CROSS-REFERENCE TO RELATED APPLICATIONS

The present application is the U.S. national phase of PCT Application PCT/CN2019/126183 filed on Dec. 18, 2019, which claims a priority to Chinese Patent Application No. 201910031922.1 filed in China on Jan. 14, 2019, which are incorporated herein by reference in their entirety.

TECHNICAL FIELD

The present disclosure relates to the field of communication technologies, and more particularly, to a display substrate, a method of forming the same and a display device.

BACKGROUND

Active matrix organic light emitting diodes (AMOLED) display products have become a trend for future display due to their wide color gamut, lightweight, high contrast and self-luminous advantages.

SUMMARY

A display substrate is provided in some embodiments of the present disclosure, including: a base substrate, and a light shielding layer, a first insulating layer, a first metal layer, a second insulating layer and a light emitting device stacked in sequence on the base substrate; wherein the second insulating layer has a first groove and a second groove, and a portion of the second insulating layer between the first groove and the second groove forms a barrier structure; the first groove is at a side of the barrier structure adjacent to the light emitting device with respect to the second groove; the first metal layer comprises a signal line at a side of the first groove away from the barrier structure and a connection terminal at a side of the second groove away from the barrier structure; the light shielding layer comprises a connection lead through which the signal line and the connection terminal are electrically connected.

According to the display substrate in some embodiments of the present disclosure, the connection terminal at the side of the second groove away from the barrier structure and the signal line at the side of the first groove away from the barrier structure are electrically connected through the connection lead of the light-shielding layer, therefore, in the case that the signal line is connected to the connection terminal, the corrosion of the first metal layer in the groove area may be avoided, the formation of the water-oxygen channel is prevented, thereby avoiding the subsequent packaging failure, improving the packaging reliability, reducing the possibility of GDS, and improving the display effect.

Optionally, an orthographic projection of the first metal layer on the base substrate does not overlap with orthographic projections of the first groove, the second groove and the barrier structure on the base substrate.

That is, the first metal layer has no pattern in the area of the first groove, the area of the second groove, and the area of the barrier structure, and the first metal layer has no pattern in the area of the first groove and the area of the second groove so that the area without the protection of the second insulating layer does not exist in the first metal layer, thereby preventing the first metal layer from being corroded in the area of the groove and preventing the formation of the water-oxygen channel while the connection of the signal line is connected to the connection terminal, thereby avoiding the subsequent packaging failure, improving the packaging reliability, and also reducing the incidence rate of the GDS and improving the display effect. Further, in the region of the first metal layer in the first groove, the region of the second groove, and the region of the barrier structure, the signal line is connected to the connection terminal through the connection lead, and a first insulating layer is on the connection lead, so that due to the first insulating layer, the connection lead is not corroded.

Optionally, the first insulating layer includes a first sub-insulating layer and a second sub-insulating layer, and the display substrate further includes a second metal layer between the first sub-insulating layer and the second sub-insulating layer;

the second metal layer includes a first lap lead and/or a second lap lead;

the connection terminal is electrically connected to the light shielding layer through the first lap lead, and the signal line is electrically connected to the light shielding layer through the second lap lead.

Optionally, the first metal layer is a source-drain metal layer, and the second metal layer is a gate metal layer.

Optionally, a thickness of the light shielding layer is equal to a thickness of the first metal layer.

Therefore, the uniformity of the thickness of the lead may be improved, and the uniformity of the resistance of the lead may be improved.

Optionally, a material of the light shielding layer is the same as a material of the first metal layer.

The thickness of the light-shielding layer is equal to the thickness of the first metal layer, and the material of the light-shielding layer is the same as the material of the first metal layer, so that the resistance of the light-shielding layer and the first metal layer may be ensured to be the same, and the influence of the increase of the lead wire loading on the product performance may be avoided.

Optionally, materials of the light shielding layer and the first metal layer include a titanium, aluminum and titanium laminate.

Optionally, the display substrate further includes an inorganic encapsulation layer covering the first groove, the second groove, the barrier structure and the light emitting device.

A method of forming a display substrate is further provided in some embodiments of the present disclosure, the method includes: forming a light-shielding layer, a first insulating layer, a first metal layer, a second insulating layer, a light-emitting device and an encapsulation layer in sequence on the base substrate; when the first insulating layer is formed, a via-hole is formed in the first insulating layer, to enable a signal line in the first metal layer to be connected to a connection lead in the light shielding layer through the via-hole and enable a connection terminal in the first metal layer to be connected to the connection lead in the light shielding layer through the via-hole.

A display device is provided in some embodiments of the present disclosure, including the display substrate described above in some embodiments of the present disclosure.

BRIEF DESCRIPTION OF THE DRAWINGS

In order that the technical solution in some embodiments of the present disclosure may be more clearly described, reference will now be made briefly to the accompanying drawings required for the description of the embodiments, and it will be apparent that the accompanying drawings in the following description are merely some of the embodiments of the present disclosure, and other drawings may be made to those skilled in the art without creative work.

DETAILED DESCRIPTION

In order that the technical problems, technical solutions, and advantages to be solved by the embodiments of the present disclosure may be made clearer, reference will now be made in detail to the drawings and specific embodiments.

Figure 1:
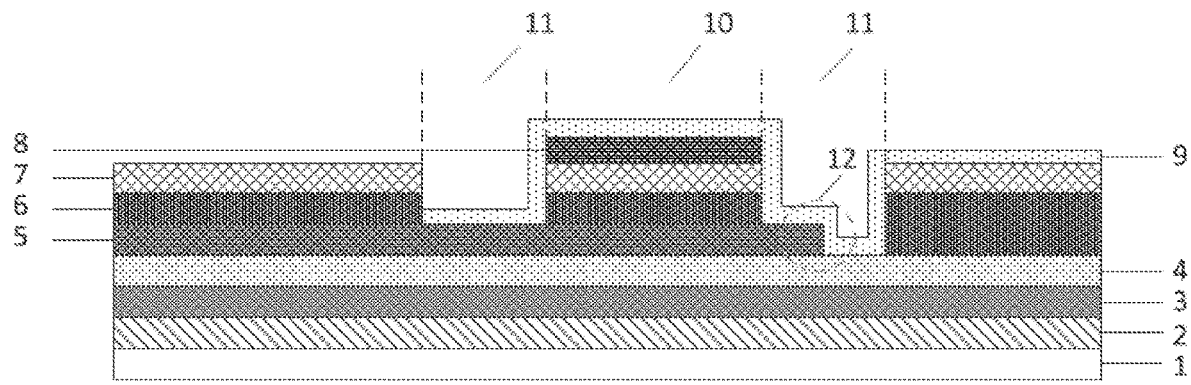
FIG. 1 is a schematic structural diagram of a display panel in the related art.
Figure 2:
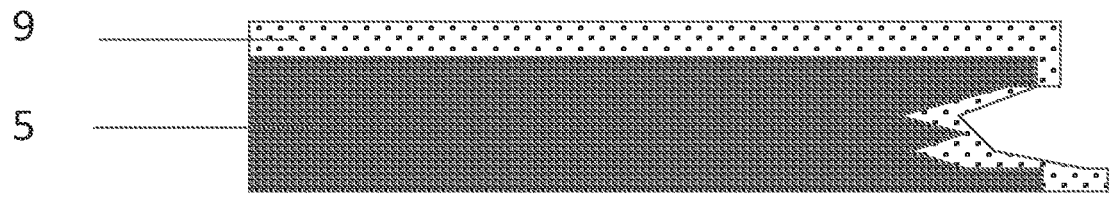
FIG. 2 is a schematic diagram of a package failure at a lead edge in the related art.

The general structure of AMOLED includes an array backplane circuit, an OLED device light-emitting layer, a cathode and an encapsulation layer. In the array backplane circuit design, the power supply line (VDD lead) and the low potential power supply line (VSS lead) of the frame region are generally the same layer as the source and drain electrodes of the thin film transistor. Taking the VDD lead as an example, as shown in FIG. 1, the display panel includes a base substrate 1, a buffer layer 2, a gate insulating layer 3, an interlayer insulating layer 4, a VDD lead 5, a planarization layer 6, a pixel definition layer 7, a spacer layer 8, and an inorganic encapsulation layer 9. Due to the packaging requirements, it is necessary to design a barrier (Dam) 10, where the VDD lead 5 has grooves 11 on both sides of the Dam10, and the VDD lead 5 turns in the grooves 11, and the VDD lead 5 has no insulating layer on both sides of the Dam10, so that the edge 12 of the VDD lead 5 is more easily corroded and becomes an oxygen channel. In addition, at the edge 12 of the VDD lead 5, as shown in FIG. 2, the edge of the VDD lead 5 is etched and the inorganic encapsulation layer 9 is cracked. As a result, the inorganic encapsulation layer is damaged, the water vapor oxygen enters the display area along the channel, the water vapor oxygen corrodes the device to form a Growing dark spot (GDS), gradually increases with time, the device performance becomes poor, and a display abnormality is caused. In summary, the related art shows that the lead wires are easily corroded in the forming process of the product, resulting in packaging failure, affecting the performance of the light-emitting device, and affecting the display effect.

Figure 3:
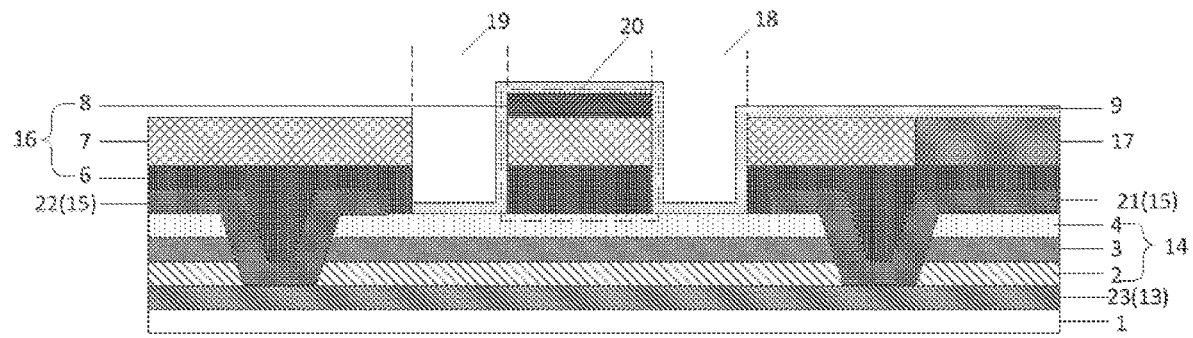
FIG. 3 is a schematic structural diagram of a display substrate in some embodiments of the present disclosure.

A display substrate is provided in some embodiments of the present disclosure. As shown in FIG. 3, the display substrate includes a base substrate 1, and a light shielding layer 13, a first insulating layer 14, a first metal layer 15, a second insulating layer 16 and a light emitting device 17 stacked in sequence on the base substrate 1; where the second insulating layer 16 has a first groove 18 and a second groove 19, and a portion of the second insulating layer 16 between the first groove 18 and the second groove 19 forms a barrier structure 20; the first groove 18 is at a side of the barrier structure 20 adjacent to the light emitting device 17 with respect to the second groove 19; the first metal layer includes a signal line 21 at a side of the first groove 18 away from the barrier structure 20 and a connection terminal 22 at a side of the second groove 19 away from the barrier structure 20; the light shielding layer 13 includes a connection lead 23 through which the signal line 21 and the connection terminal 22 are electrically connected.

According to the display substrate in some embodiments of the present disclosure, the connection terminal at the side of the second groove away from the barrier structure and the signal line at the side of the first groove away from the barrier structure are electrically connected through the connection lead of the light shielding layer, therefore, in the case that the signal line is connected to the connection terminal, the corrosion of the first metal layer in the groove area may be avoided, the formation of the water-oxygen channel is prevented, thereby avoiding the subsequent packaging failure, improving the packaging reliability, reducing the possibility of GDS, and improving the display effect.

Optionally, as shown in FIG. 3, an orthographic projection of the first metal layer 15 on the base substrate does not overlap with orthographic projections of the first groove 18, the second groove 19 and the barrier structure 20 on the base substrate 1.

That is, the first metal layer has no pattern in the area of the first groove, the area of the second groove, and the area of the barrier structure, and the first metal layer has no pattern in the area of the first groove and the area of the second groove so that the area without the protection of the second insulating layer does not exist in the first metal layer, thereby preventing the first metal layer from being corroded in the area of the groove and preventing the formation of the water-oxygen channel while the connection of the signal line is connected to the connection terminal, thereby avoiding the subsequent packaging failure, improving the packaging reliability, and also reducing the incidence rate of the GDS and improving the display effect. Further, in the region of the first metal layer in the first groove, the region of the second groove, and the region of the barrier structure, the signal line is connected to the connection terminal through the connection lead, and a first insulating layer is on the connection lead, so that due to the first insulating layer, the connection lead is not corroded.

It should be noted that, as shown in FIG. 3, the first insulating layer 14 includes a buffer layer 2, a gate insulating layer 3, and an interlayer insulating layer 4. The second insulating layer 16 includes a planarization layer 6, a pixel definition layer 7, and a spacer layer 8. The shading layer may for example be used for fingerprint identification.

In the display substrate in some embodiments of the present disclosure, the signal lines may be VDD leads or VSS leads.

Figure 4:
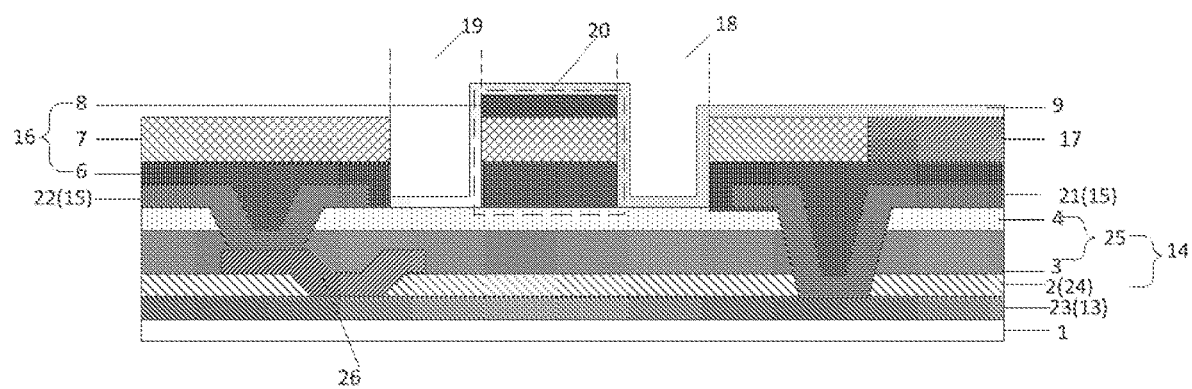
FIG. 4 is a schematic structural diagram of another display substrate in some embodiments of the present disclosure.
Figure 5:
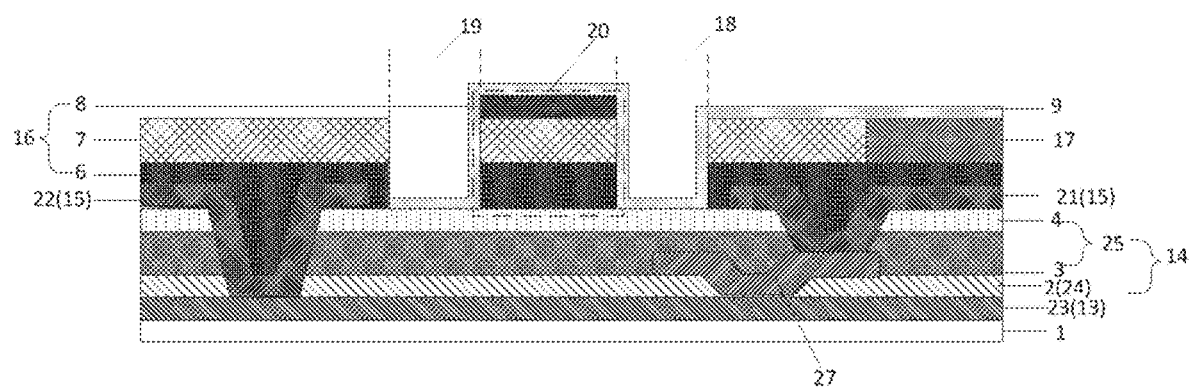
FIG. 5 is a schematic structural diagram of yet another display substrate in some embodiments of the present disclosure.
Figure 6:
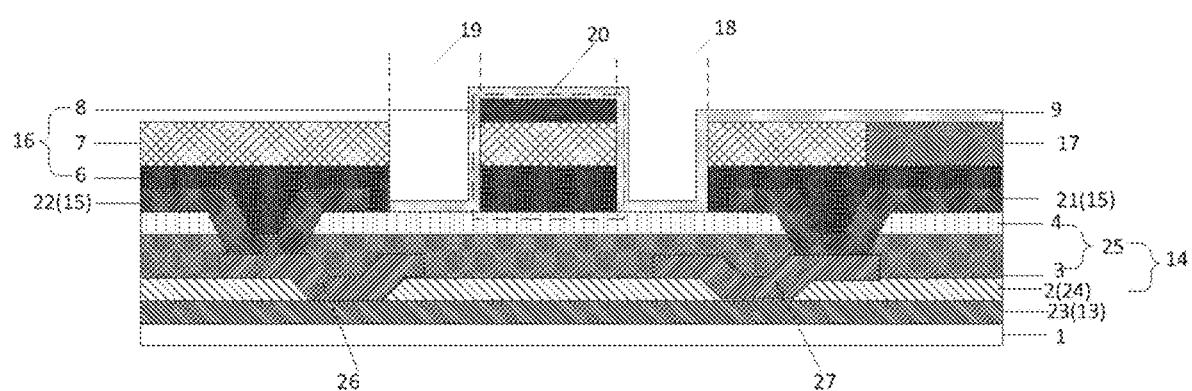
FIG. 6 is a schematic structural diagram of yet another display substrate in some embodiments of the present disclosure.

Optionally, as shown in FIGS. 4 to 6, the first insulating layer 14 includes a first sub-insulating layer 24 and a second sub-insulating layer 25, and the display substrate further includes a second metal layer between the first sub-insulating layer 24 and the second sub-insulating layer 25.

The second metal layer includes a first lap lead 26 and/or a second lap lead 27;

The connection terminal 22 is electrically connected to the light shielding layer 13 through the first lap lead 26, and the signal line 21 is electrically connected to the light shielding layer 13 through the second lap lead 27.

In FIGS. 4-6, the first sub-insulating layer 24 includes the buffer layer 2, and the second sub-insulating layer 25 includes the gate insulating layer 3 and the interlayer insulating layer 4. In FIG. 4, the connection terminal 22 is electrically connected to the light shielding layer 13 through the first lap lead 26, and the signal line 21 is directly electrically connected to the light shielding layer 13. In FIG. 5, the signal line 21 is electrically connected to the light shielding layer 13 through the second lap lead 27, and the connection terminal 22 is directly electrically connected to the light shielding layer 13. In FIG. 6, the connection terminal 22 is electrically connected to the light shielding layer 13 through the first lap lead 26, and the signal line 21 is electrically connected to the light shielding layer 13 through the second lap lead 27.

Optionally, the first metal layer is a source-drain metal layer, and the second metal layer is a gate metal layer.

It should be noted that the gate in the display substrate may include a first gate metal layer and a second gate metal layer, the gate insulating layer includes a first gate insulating layer and a second gate insulating layer, the first gate insulating layer is located between the first gate metal layer and the second gate metal layer, and the second gate insulating layer is located above the second gate metal layer. The first lap lead may be arranged in the same layer as the first gate metal layer, or may be arranged in the same layer as the second gate metal layer, and the second lap lead may be provided in the same layer as the first gate metal layer, or may be provided in the same layer as the second gate metal layer.

Figure 7:
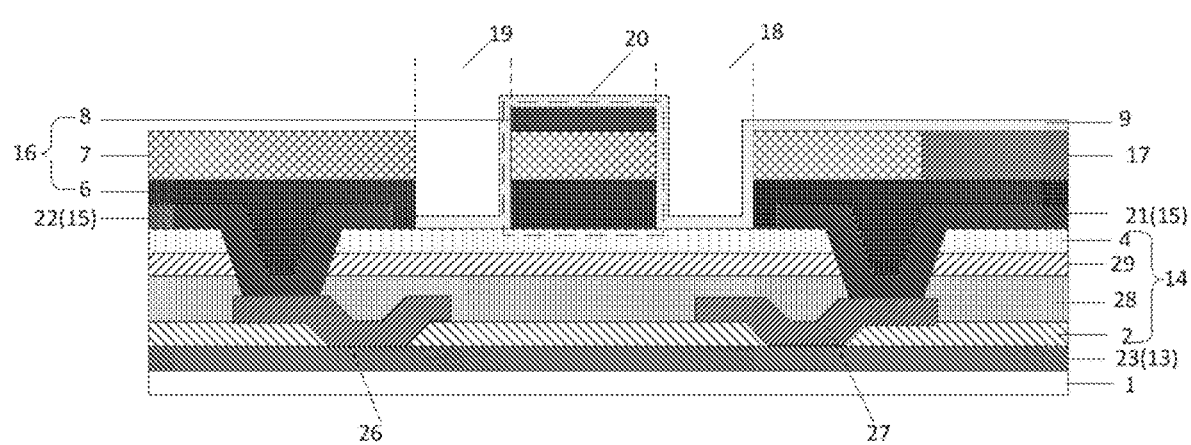
FIG. 7 is a schematic structural diagram of yet another display substrate in some embodiments of the present disclosure.
Figure 8:
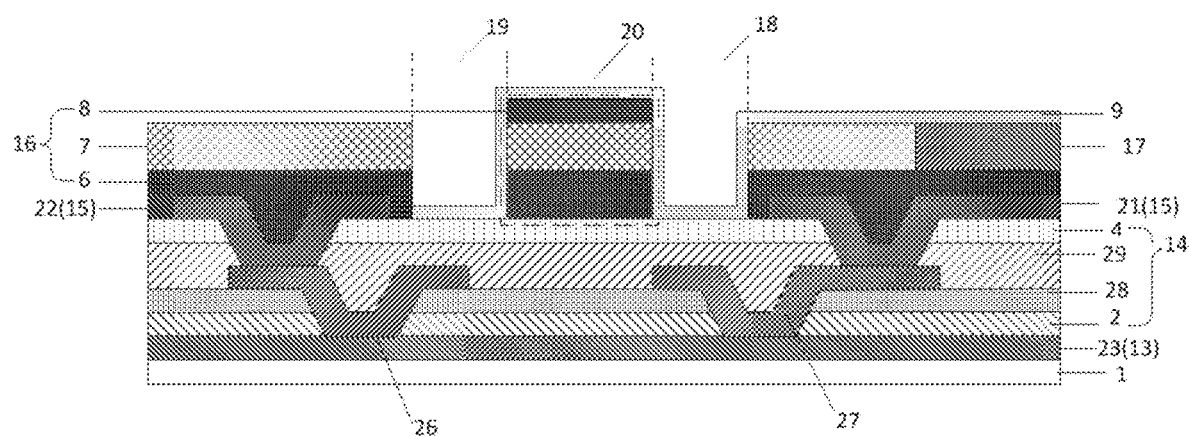
FIG. 8 is a schematic structural diagram of yet another display substrate in some embodiments of the present disclosure.

For example, as shown in FIG. 7, the second metal layer includes the first lap lead and the second lap lead, the gate insulating layer includes a first gate insulating layer 28 and a second gate insulating layer 29, and the first lap lead 26 and the second lap lead 27 are on the buffer layer 2 and in the same layer as the first gate metal layer. As shown in FIG. 8, the gate insulating layer includes a first gate insulating layer 28 and a second gate insulating layer 29, the first lap lead 26 and the second lap lead 27 are disposed in the same layer as the second gate metal layer, and the first lap lead 26 and the second lap lead 27 are disposed between the first gate insulating layer 28 and the second gate insulating layer 29.

Optionally, the thickness of the light shielding layer is equal to the thickness of the first metal layer. Therefore, the uniformity of the thickness of the lead wire may be improved, and the uniformity of the resistance of the lead wire may be improved.

Optionally, the material of the light shielding layer is the same as the material of the first metal layer.

The thickness of the light-shielding layer is equal to the thickness of the first metal layer, and the material of the light-shielding layer is the same as the material of the first metal layer, so that the resistance of the light-shielding layer and the first metal layer may be ensured to be the same, and the influence of the loading on the product performance may be avoided.

Optionally, materials of the light shielding layer and the first metal layer include a titanium, aluminum and titanium laminate.

Other materials may of course be used for the light shielding layer and the first metal layer.

Optionally, as shown in FIGS. 1 to 8, the display substrate further includes an inorganic encapsulation layer 9 covering the first recess 18, the second recess 19, the barrier structure 20 and the light emitting device 17.

A method of forming the above-described display substrate in some embodiments of the present disclosure is further provided in some embodiments of the present disclosure, the method includes: forming a light-shielding layer, a first insulating layer, a first metal layer, a second insulating layer, a light-emitting device and an encapsulation layer in sequence on the base substrate; when the first insulating layer is formed, a via-hole is formed in the first insulating layer, to enable a signal line in the first metal layer to be connected to a connection lead in the light shielding layer through the via-hole and enable a connection terminal in the first metal layer to be connected to the connection lead in the light shielding layer through the via-hole.

Optionally, the first insulating layer includes a first sub-insulating layer and a second sub-insulating layer, the method further includes forming a second metal layer between the first sub-insulating layer and the second sub-insulating layer. When the first sub-insulating layer is formed, a via-hole is formed in the first sub-insulating layer so that a first lap lead and/or a second lap lead in the second metal layer are connected to a connection lead in the light shielding layer through the via-hole. When the second sub-insulating layer is formed, a via-hole is formed in the second sub-insulating layer so that a connection terminal in the first metal layer is connected to the first lap wire through the via-hole, and/or a signal line in the first metal layer is connected to the second lap wire through the via-hole.

Optionally, the second insulating layer includes a planarization layer, a pixel definition layer, and a spacer layer; the first sub-insulating layer is a buffer layer, and the second sub-insulating layer includes a gate insulating layer and an interlayer insulating layer. Alternatively, the first sub-insulating layer includes a buffer layer, and the second sub-insulating layer includes a first gate insulating layer, a second gate insulating layer, and an interlayer insulating layer. Alternatively, the first sub-insulating layer includes a buffer layer and a first gate insulating layer, and the second sub-insulating layer includes a second gate insulating layer and an interlayer insulating layer.

A display device is further provided in some embodiments of the present disclosure, including the display substrate described above in some embodiments of the present disclosure.

The display device provided in some embodiments of the present disclosure may be, for example, a mobile phone, a tablet computer, or the like.

In summary, according to the display substrate, the method of forming the same and a display device, a connection terminal at a side of the second groove away from the barrier structure is electrically connected to a signal line at a side of the first groove away from the barrier structure through a connection lead of a light-shielding layer, therefore, in the case that the signal line is connected to the connection terminal, the corrosion of the first metal layer in the groove area may be avoided, the formation of the water-oxygen channel is prevented, thereby avoiding the subsequent packaging failure, improving the packaging reliability, reducing the possibility of GDS, and improving the display effect.

It will be apparent to those skilled in the art that various modifications and variations of the present disclosure may be made without departing from the principle of the present disclosure. Thus, provided that such modifications and variations of the present disclosure are within the scope of some of the claims of the present disclosure and equivalents thereof, some of the present disclosure is also intended to include such modifications and variations.

What is claimed is:

1. A display substrate, comprising: a base substrate, and a light shielding layer, a first insulating layer, a first metal layer, a second insulating layer and a light emitting device stacked in sequence on the base substrate; wherein
the second insulating layer has a first groove and a second groove, and a portion of the second insulating layer between the first groove and the second groove forms a barrier structure;
the first groove is at a side of the barrier structure adjacent to the light emitting device with respect to the second groove;
the first metal layer comprises a signal line at a side of the first groove away from the barrier structure and a connection terminal at a side of the second groove away from the barrier structure;
the light shielding layer comprises a connection lead through which the signal line and the connection terminal are electrically connected.

2. The display substrate according to claim 1, wherein an orthographic projection of the first metal layer on the base substrate does not overlap with orthographic projections of the first groove, the second groove and the barrier structure on the base substrate.

3. The display substrate according to claim 1, wherein the first insulating layer comprises a first sub-insulating layer and a second sub-insulating layer, and the display substrate further comprises a second metal layer between the first sub-insulating layer and the second sub-insulating layer;
the second metal layer comprises a first lap lead and/or a second lap lead;
the connection terminal is electrically connected to the light shielding layer through the first lap lead, and the signal line is electrically connected to the light shielding layer through the second lap lead.

4. The display substrate according to claim 2, wherein the first metal layer is a source-drain metal layer, and the second metal layer is a gate metal layer.

5. The display substrate according to claim 1, wherein a thickness of the light shielding layer is equal to a thickness of the first metal layer.

6. The display substrate according to claim 1, wherein a material of the light shielding layer is the same as a material of the first metal layer.

7. The display substrate according to claim 1, wherein materials of the light shielding layer and the first metal layer comprise a titanium, aluminum and titanium laminate.

8. The display substrate according to claim 1, further comprising an inorganic encapsulation layer covering the first groove, the second groove, the barrier structure and the light emitting device.

9. A method of forming a display substrate according to claim 1, comprising: forming a light-shielding layer, a first insulating layer, a first metal layer, a second insulating layer, a light-emitting device and an encapsulation layer in sequence on the base substrate; wherein
when the first insulating layer is formed, a via-hole is formed in the first insulating layer, to enable a signal line in the first metal layer to be connected to a connection lead in the light shielding layer through the via-hole and enable a connection terminal in the first metal layer to be connected to the connection lead in the light shielding layer through the via-hole.

10. A display device comprising the display substrate according to claim 1.

* * * * *